FLIP CHIP THICK FILM DEVICE

Filed May 22, 1967

INVENTORS
CHARLES D. MULFORD JR.
CHARLES F. CARROLL
BY [signature]
ATTORNEY

United States Patent Office 3,539,882
Patented Nov. 10, 1970

3,539,882

FLIP CHIP THICK FILM DEVICE

Charles D. Mulford, Jr., Union, and Charles F. Carroll, West Long Branch, N.J., assignors, by mesne assignments, to Solitron Devices, Inc., Tappan, N.Y., a corporation of New York Filed May 22, 1967, Ser. No. 640,301
Int. Cl. H01l 3/00, 5/00, 11/00
U.S. Cl. 317—234 3 Claims

ABSTRACT OF THE DISCLOSURE

A thick film device that utilizes a flip chip type of semiconductor device mounted in an inverted manner on a thick film substrate.

BACKGROUND OF THE INVENTION

Field of the invention

The invention relates to the field of microcircuits in which semiconductor devices and passive components are mounted on a thick film substrate together with circuitry for connecting the components.

Description of prior art

Heretofore it has been a problem in mounting semiconductor devices on a thick film circuit. In most cases it was necessary to mount the semiconductor on a separate mount adjacent to the thick film circuit and make connections thereto by leads. This did not permit the compact packaging desirable and made the application more costly and less reliable. Applicants invention provides a method of mounting a semiconductor device directly on the thick film circuit by using the flip chip construction.

SUMMARY

The invention is directed to thick film integrated circuits without the need for adding special fabrication to the ceramic substrate itself. The technique involved provides ease of fabrication and reduces cost.

DESCRIPTION OF THE PREFERRED EMBODIMENTS

Figure 1:
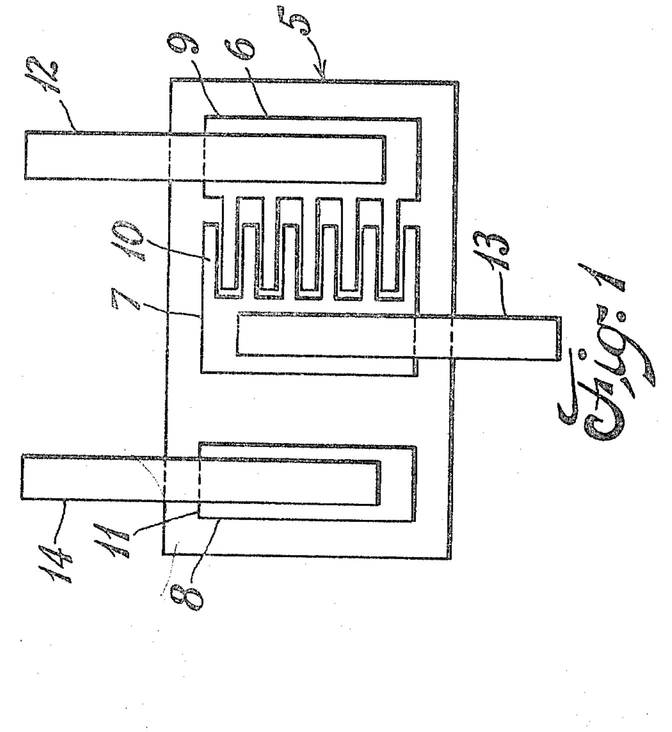
FIG. 1 is a diagrammatic view of a semiconductor utilized in one embodiment of the invention.

Referring now to FIG. 1 of the drawing, a semiconductor device, which for the purpose of illustration is a planor type transistor, is indicated generally by the numeral 5. The transistor 5 includes an emitter 6, base 7 and collector 8 which may be fabricated from a chip of silicon by the conventional method of masking a diffusing to obtain the desired junctions. The emitter 6 is provided with a contact 9 which may be made by the electrolytic deposition of lead over nickel mask. In like manner the base 7 and collector 8 are provided with respective contacts 10 and 11. An emitter contact lead 12 is secured to the emitter contact 9, for example, by soldering at 300°. The contact lead 12 is preferably of silver. In like manner the base contact 10 and collector contact 11 have a base contact lead 13 and collector contact level 14 respectively and secured similar to that of the emitter contact lead 12.

Figure 2:
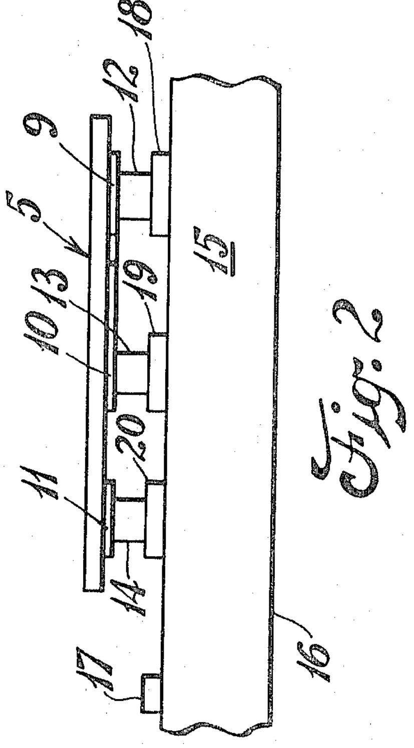
FIG. 2 is an end view illustrating the mounting of the device of FIG. 1 on a thick film substrate.

Referring now to FIG. 2 a thick film device is indicated generally by the numeral 15. The device 15 includes a thick film substrate 16 which may be a ceramic. The substrate 16 has a circuit 17 thereon which may be formed by the standard screen and fire process or other suitable way. The circuit 17 may contain resistors, capacitors and other circuit elements. In addition the circuit 17 includes conductive pads 18, 19 and 20 which form connections to various circuit elements.

The device 5, from FIG. 1, is inverted and positioned so that the contact leads 12, 13, and 14 are positioned on the respective pads 18, 19, and 20. The leads 12, 13, and 14 are secured to the pads 18, 19, and 20 by soldering at 200° to form a unitary structure. The thick film device 15 may now be encapsulated or domed.

Figure 3:
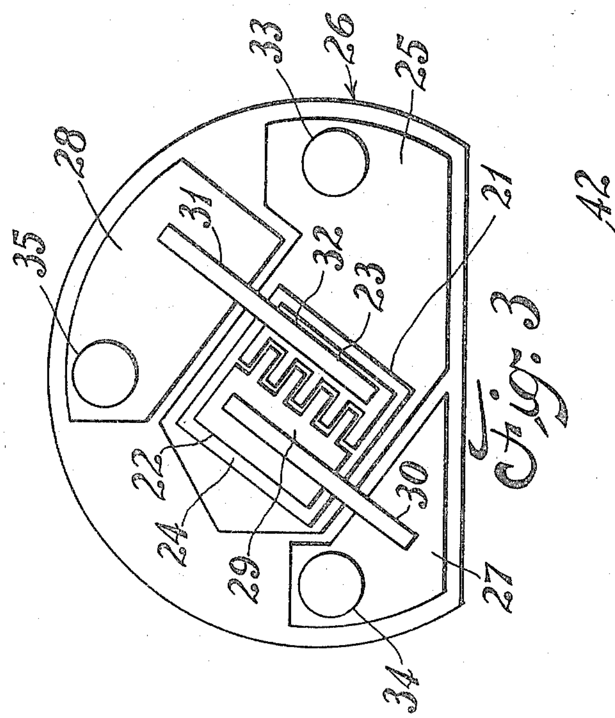
FIG. 3 is a diagrammatic view of a device illustrating another embodiment of the invention.
Figure 4:
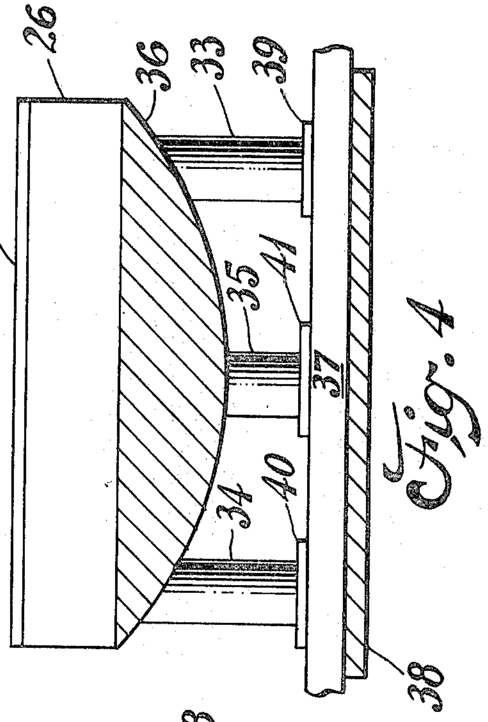
FIG. 4 is an end view illustrating the mounting of the device of FIG. 3 on a thick film substrate.

Referring now to FIGS. 3 and 4 for another embodiment of the invention a transistor is indicated generally by the numeral 21 and has an emitter 22, base 23 and collector 24 which may be formed by diffusion or any other conventional manner. The collector 24 is mounted by soldering or other suitable manner to a metalized section 25 of a ceramic 26. In addition to the metalized section 25, the ceramic 26 has metalized sections 27 and 28. The metalized sections are preferably of gold.

The emitter 22 of the transistor 21 has an emitter contact 29 of lead or other suitable material. An emitter contact lead 30 has one end thereof secured to the emitter contact 29 and the other end to the metalized section 27 of the ceramic 26.

In like manner, the base 23 has a base contact 31 and a base contact lead 32 one end of which is secured to the base contact 31 and the other end to the metalized section 28 of the ceramic 26. Each of the metalized sections 25, 27, and 28 has a conductive post 33, 34, and 35 respectively which may be of gold nickel or other suitable material and secured to sections 25, 27, and 28 by welding or any other suitable method.

The transistor 21 together with the metalized sections 25, 27, and 28 are encapsulated with a suitable epoxy 36 with the post 33, 34, and 35 extending out of the epoxy 36. A thick film circuit indicated generally by the numeral 37 has a ceramic substrate 38. The substrate 38 has a plurality of circuits thereon including connecting pads 39, 40, and 41. The circuits including the pads 39, 40, and 41 may be formed on the substrate 38 by standard screen and fire process or other conventional manner. Only the pad portion of the circuits have been illustrated but it is understood that they could be any of a number of circuits.

The ceramic 26 with the transistor 21 is positioned on the circuit 37 so that the posts 33, 34, and 35 are on the conductor pads 39, 40 and 41 respectively. The posts 39, 40, and 41 are then secured to the respective pads 39, 40, and 41 by soldering. While only one transistor assembly has been illustrated, it is understood that it is not limited to only one on a circuit but could be any number desired. In some applications it may be desirable to provide the ceramic 26 with a metalized coating 42 on the side opposite the transistor 21 for attachment of a heat sink.

The aforenoted embodiments provide a compact means for mounting transistors on a thick film circuit.

Although only two embodiments of the invention has been illustrated and described, various changes in the form and relative arrangements of the parts, which will now appear to those skilled in the art, may be made without departing from the scope of the invention.

What is claimed is:

1. A thick film device comprising a ceramic substrate, a plurality of mounting pads on said substrate, each of said mounting pads having a post of conducting material extending upwards therefrom, a semiconductor device, said semiconductor device having a plurality of contacts extending laterally therefrom, means securing said contacts to said respective mounting pads, a thick film circuit having mounting pads in register with said post, and means for securing said post to said last named mounting pads to form a unitary structure.

2. The combination as set forth in claim 1 in which said semiconductor device is encapsulated.

3. The combination as set forth in claim 1 in which one of said contacts is mounted directly on one of said first named mounting pads.

References Cited

UNITED STATES PATENTS

| | | | |
|---|---|---|---|
| 3,292,240 | 12/1966 | McNutt et al. | 29—577 |
| 3,303,393 | 2/1967 | Hymes et al. | 317—101 |
| 3,361,868 | 1/1968 | Bachman | 317—234 X |
| 3,373,481 | 3/1968 | Lins et al. | 317—234 X |
| 3,374,533 | 3/1968 | Burks et al. | 29—577 |
| 3,380,155 | 4/1968 | Burks | 29—591 |
| 3,388,301 | 6/1968 | James | 317—234 |
| 3,404,215 | 10/1968 | Burks et al. | 317—234 X |

JOHN W. HUCKERT, Primary Examiner

R. F. POLISSACK, Assistant Examiner

U.S. Cl. X.R.

317—235